(12) United States Patent
Aritome

(10) Patent No.: US 7,800,947 B2
(45) Date of Patent: Sep. 21, 2010

(54) MULTIPLE SELECT GATES WITH NON-VOLATILE MEMORY CELLS

(75) Inventor: Seiichi Aritome, Zhudong (TW)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 12/195,146

(22) Filed: Aug. 20, 2008

(65) Prior Publication Data

US 2008/0310233 A1 Dec. 18, 2008

Related U.S. Application Data

(62) Division of application No. 11/411,376, filed on Apr. 26, 2006, now Pat. No. 7,433,231.

(51) Int. Cl.
*G11C 16/04* (2006.01)
(52) U.S. Cl. .................. 365/185.17; 365/185.18; 365/185.24; 365/185.28
(58) Field of Classification Search ........... 365/185.17, 365/185.18, 185.24
See application file for complete search history.

(56) References Cited

U.S. PATENT DOCUMENTS

| | | | |
|---|---|---|---|
| 5,698,879 A | 12/1997 | Aritome et al. | |
| 6,191,975 B1 | 2/2001 | Shimizu et al. | |
| 6,266,275 B1 * | 7/2001 | Chen et al. | 365/185.18 |
| 6,380,636 B1 * | 4/2002 | Tatsukawa et al. | 257/390 |
| 6,859,397 B2 | 2/2005 | Lutze et al. | |
| 6,982,905 B2 | 1/2006 | Nguyen | |
| 7,005,699 B2 | 2/2006 | Chen et al. | |
| 7,012,835 B2 | 3/2006 | Gonzalez et al. | |
| 7,433,231 B2 | 10/2008 | Aritome | |
| 2004/0228197 A1 | 11/2004 | Mokhlesi | |
| 2005/0056869 A1 | 3/2005 | Ichige et al. | |
| 2006/0044908 A1 | 3/2006 | Ha | |

OTHER PUBLICATIONS

United States Patent and Trademark Office Action for related U.S. Appl. No. 11/411,376 dated Feb. 25, 2008 (12 pgs.).
Applicants Amendment and Response dated Mar. 18, 2008 to Examiner's Office Action dated Feb. 25, 2008 (24 pgs.).

* cited by examiner

*Primary Examiner*—Hoai V Ho
(74) *Attorney, Agent, or Firm*—Brooks, Cameron & Huebsch, PLLC

(57) ABSTRACT

Multiple select gates in association with non-volatile memory cells are described. Various embodiments include multiple select gate structure, process, and operation and their applicability for memory devices, modules, and systems. In one embodiment a memory array is described. The memory array includes a number of select gates coupled in series to a number of non-volatile memory cells. A first select gate includes a control gate and a floating gate electrically connected together and a second select gate includes a control gate and a floating gate which are electrically separated by a dielectric layer.

9 Claims, 13 Drawing Sheets

| | PREPROGRAM | ERASE | ERASE VERIFY | PROGRAM (WL-1) | READ (WL-1 READ) |
|---|---|---|---|---|---|
| BL | 0 V | FLOATING | 1.0 V | 0 V/Vcc | 1.0 V |
| SGD-0 | Vcc | FLOATING | 4.5 V | Vcc→1.0 V | (4.5 V) Vpass_read |
| SGD-1 | Vpre-pgm | 0 V | 0 V | Vcc | 4.5 V |
| WL-31 | Vpre-pgm | 0 V | 0 V | Vpass (10 V) | 4.5 V |
| WL-30 | Vpre-pgm | 0 V | 0 V | Vpass | 4.5 V |
| WL-29 | Vpre-pgm | 0 V | 0 V | Vpass | 4.5 V |
| ⋮ | ⋮ | ⋮ | ⋮ | ⋮ | ⋮ |
| WL-1 | Vpre-pgm | 0 V | 0 V | Vpgm | 0 V |
| WL-0 | Vpre-pgm | 0 V | 0 V | Vpass | 4.5 V |
| SGS-1 | Vpre-pgm | 0 V | 0 V | Vcc | 4.5 V |
| SGS-0 | 0 V | FLOATING | 4.5 V | 0 V | 4.5 V |
| SOURCE | Vcc | FLOATING | 0 V | Vcc | 0 V |
| P-well (+N-well) | 0 V | Vera=20 V | 0 V | 0 V | 0 V |

*Fig. 3*

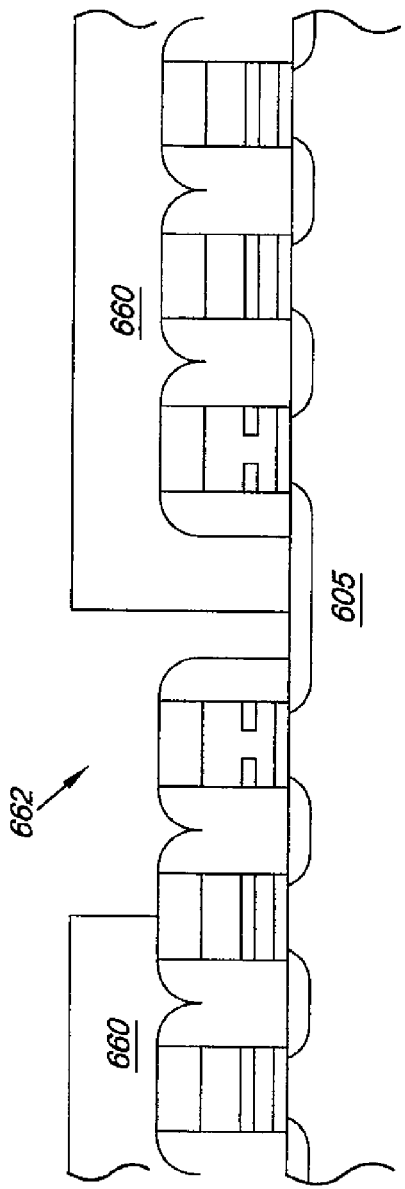
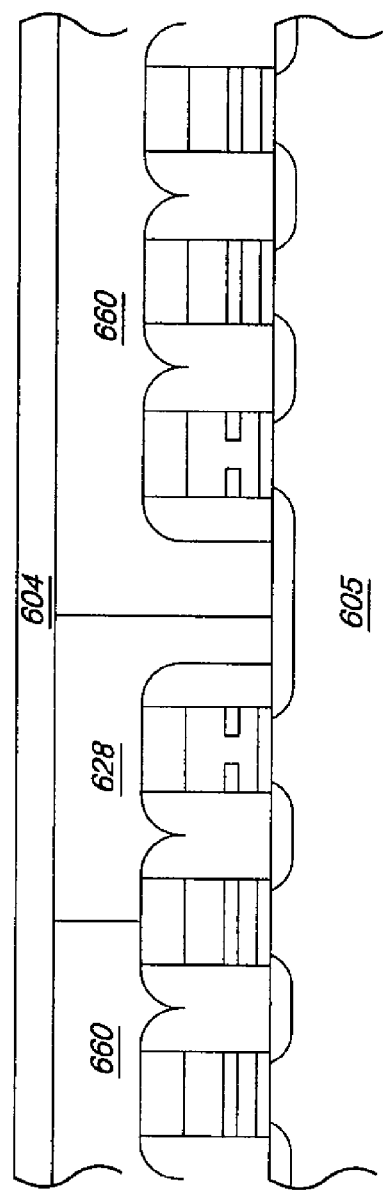
Fig. 6H
Fig. 6I

| | ERASE | | | | | PROGRAM | | READ |
| --- | --- | --- | --- | --- | --- | --- | --- | --- |
| | PRE PROGRAM | ERASE | ERASE VERIFY | SOFT PROGRAM① | SOFT PROGRAM② | WL-0 | WL-2 | WL-0 |
| BL | 0 V | FLOATING | 0 V | 0 V | 0 V | 0 V/Vccr | 0 V/Vccr | 1.0 V |
| SGD-0 | 3.6 V | FLOATING | 3.6 V | 3.6 V | 3.6 V | 3.6 V | 3.6 V | 3.6 V |
| SGD-1 | 3.6 V | FLOATING | 3.6 V | 3.6 V | 3.6 V | 3.6 V | 3.6 V | 3.6 V |
| WL-31 | $V_{ppgm}$ | 0 V | 0 V | $V_{spgm}$ | $V_{pass}$ | $V_{pass}$ | $V_{pass}$ | $V_{pass\_read}$ (5 V) |
| WL-30 | ↓ | ↓ | ↓ | ↓ | ↓ | ↓ | ↓ | ↓ |
| WL-29 | | | | | | | | |
| ⋮ | | | | | | | | |
| WL-2 | | | | | | $V_{pass}$ | $V_{pgm}$ | |
| WL-1 | | | | | | $V_{pass}$ | $V_{pass}$ | |
| WL-0 | ↓ | ↓ | ↓ | ↓ | ↓ | $V_{pgm}$ | $V_{pass}$ | 0 V |
| SGS-1 | 0 V | FLOATING | 3.6 V | 0 V | $V_{spgm2}$ | $V_{pass}$ | $V_{pass}$ OR Vcc (0-5 V) | 3.6 V |
| SGS-0 | 0 V | FLOATING | 3.6 V | 0 V | 0 V | 0 V | 0 V | 3.6 V |
| SOURCE | Vccr | FLOATING | Vccr | Vccr | Vccr | Vccr | Vccr | 0 V |
| Well | 0 V | $V_{erase}$ | 0 V | 0 V | 0 V | 0 V | 0 V | 0 V |

*Fig. 8*

MULTIPLE SELECT GATES WITH NON-VOLATILE MEMORY CELLS

PRIORITY INFORMATION

This application is a Divisional of U.S. patent application Ser. No. 11/411,376 filed Apr. 26, 2006, now issued as U.S. Pat. No. 7,433,231, the specification of which is incorporated by reference herein.

TECHNICAL INFORMATION

The present disclosure relates generally to semiconductor devices and, more particularly, to memory devices having multiple select gates for drain side and/or source side of, for example, NAND strings.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures, so called for the logical form in which the basic memory cell configuration or each is arranged. In the NOR array architecture, the floating gate memory cells of the memory array are arranged in a matrix. The gates of each floating gate memory cell of the array matrix are coupled by rows to word select lines and their drains are coupled to column bit lines. The NOR architecture floating gate memory array is accessed by a row decoder activating a row of floating gate memory cells by selecting the word select line coupled to their gates. The row of selected memory cells then place their data values on the column bit lines by flowing different currents depending on if a particular cell is in a programmed state or an erased state.

A NAND array architecture also arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

The NAND architecture floating gate memory array is accessed by a row decoder activating a row of floating gate memory cells by selecting the word select line coupled to their gates. A high bias voltage is applied to a select gate drain line SG(D). In addition, the word lines coupled to the gates of the unselected memory cells of each group are driven to operate the unselected memory cells of each group as pass transistors so that they pass current in a manner that is unrestricted by their stored data values. Current then flows from the source line to the column bit line through each series coupled group, restricted only by the selected memory cells of each group. This places the current encoded data values of the row of selected memory cells on the column bit lines.

As the performance of electronic systems employing flash memory devices increases, flash memory device performance should also increase. A performance increase includes reducing power consumption, increasing speed, and increasing the memory density. One way to accomplish these tasks is by decreasing the size of the memory array and its individual devices.

Unfortunately, there can be resulting problems with decreasing device sizes. For example, as the channel length and gate oxide thickness are reduced in a field-effect transistor, leakage current generally increases. One type of leakage current is gate induced drain leakage (GIDL) that results from the depletion at the drain surface below the gate-drain overlap region. GIDL can cause a problem referred to as program disturb during a programming operation of a flash memory array.

FIG. 1 illustrates a portion of a typical prior art NAND flash memory array. During a program operation to program a memory cell 101, the word line 102 coupled to that cell 101 may be biased with a 20V programming pulse. The bit line 104 coupled to that cell may be brought to ground potential. This provides a gate to source potential of 20V across the cell 101 to be programmed.

The other cells on the selected word line 102 will also have the 20V programming pulse applied. In order to inhibit these cells from being programmed, their bit lines 104 may be biased to a supply potential (Vcc). Additionally, the remaining unselected word lines may be biased with 10V pulses. This biasing creates a channel voltage of approximately 7V on the unselected cell 103. This provides a gate to source voltage of approximately 13V that is generally below the required programming voltage for such cells.

However, the resulting drain to gate field for the drain select gates (SGD) and source select gates (SGS) may, in this scenario, approach 7V, which can cause the 7V channel potential on the unselected cell 103 to leak away, thus creating the possibility that the unselected cell 103 is programmed. This is referred to in the art as program disturb. To mitigate the effects of GIDL, and thus to mitigate the occurrence of program disturb, select transistors of the NAND strings are generally sized to haw a gate length much greater than any of the memory cells of the string. Increasing the gate length of the select transistors runs counter to the desire to decrease memory array size.

BRIEF DESCRIPTION OF THE DRAWINGS

FIG. 3 illustrates one embodiment for operation voltages applied to various gates of a string of non-volatile memory cells including multiple select gates.

FIGS. 6A-6I illustrate a method embodiment for forming multiple select gates in association with a string of non-volatile memory cells.

FIG. 8 illustrates additional embodiments for operation voltages applied to various gates of a string of non-volatile memory cells including multiple select gates.

DETAILED DESCRIPTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention.

The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

As used herein the term "electrically connected" is intended to imply an ability to directly connect an electrical current between at least two electrically conducting materials. And, as used herein, "electrically conducting material(s) and/or layer(s)" is intended to include doped and un-doped semiconductor materials. Further, as used herein, "electrically coupled" is intended to refer to at least one electrically conductive or conducting material and/or layer's ability to electrically influence (e.g., influence the electrical state or behavior) a neighboring electrically conducting material through capacitive coupling or otherwise, whether or not the two electrically conducting materials and/or layers are separated by an insulator or dielectric material. As one of ordinary skill in the art will appreciate, a "dielectric material and/or layer" is a material and/or layer that does not directly conduct electrical current.

Figure 2:
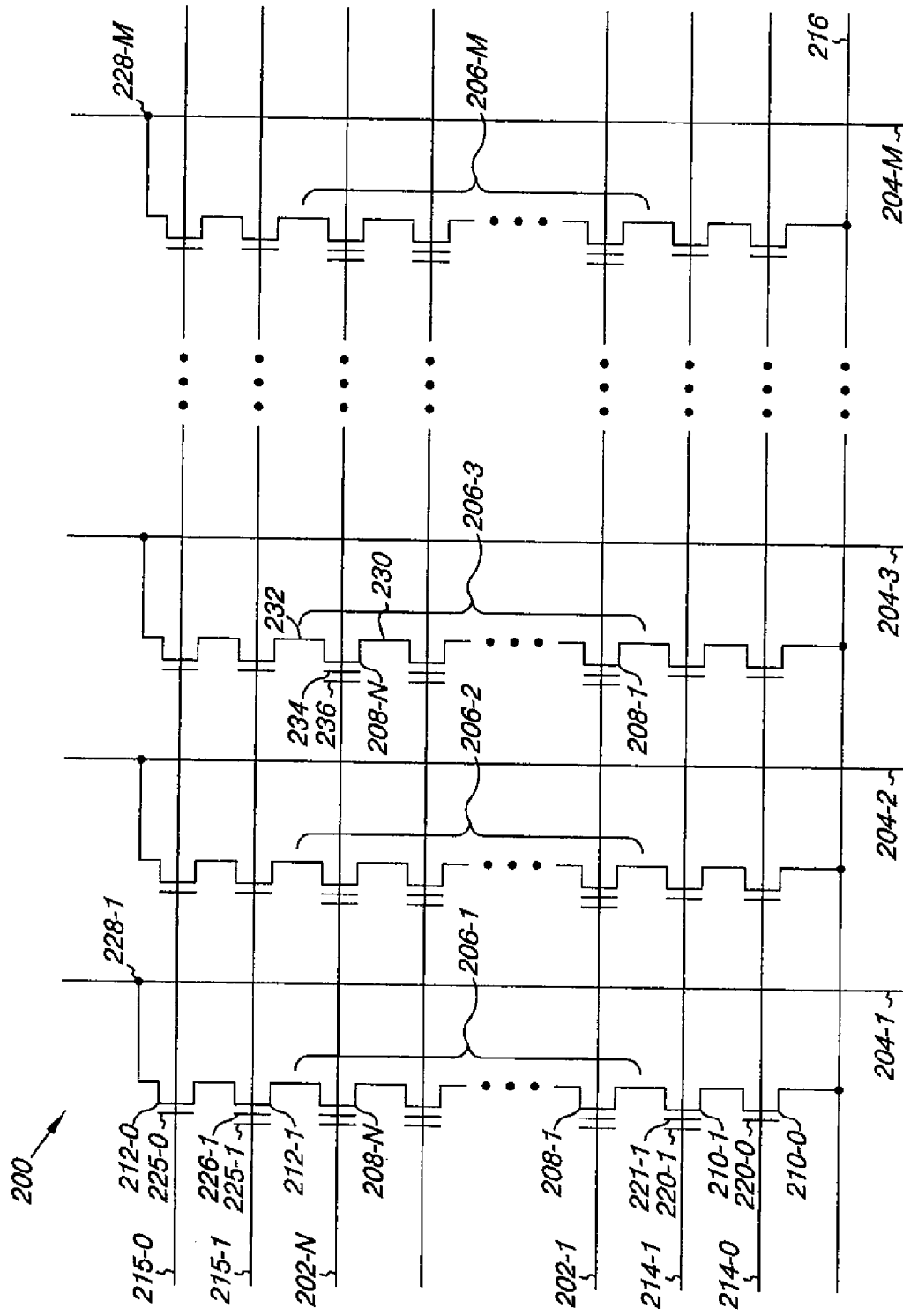
FIG. 2 is a schematic of a portion of a memory array in accordance with an embodiment of the present disclosure.

FIG. 2 is a schematic of a portion of a NAND memory array 200 in accordance with an embodiment of the present disclosure. As shown in FIG. 2, the memory array 200 includes word lines 202-1 to 202-N and intersecting bit lines 204-1 to 204-M. For ease of addressing in the digital environment, the number of word lines 202 and the number of bit lines 204 are each some power of two, e.g., 256 word lines 202 by 4,096 bit lines 204.

Memory array 200 includes NAND strings 206-1 to 206-M. Each NAND string includes non-volatile memory cells 208-1 to 208-N, each located at an intersection of a word line 202 and a local bit line 204. The non-volatile memory cells 208 of each NAND string 206 are connected in series source to drain between series-connected source select gates 210-0 and 210-1, e.g., field-effect transistors (FETs), and series-connected drain select gates 212-0 and 212-1, e.g., FETs. Source select gates 210-0 and 210-1 are located at intersections of a local bit line 204-1 and source select lines 214-0 and 214-1, while drain select gates 212-0 and 212-1 are located at intersections of a local bit line 204-1 and drain select lines 215-0 and 215-1. For one embodiment, source select gates 210-0 and 210-1 and/or drain select gates 212-0 and 212-1 are enhancement-type devices.

The embodiment of FIG. 2 illustrates a first and a second series coupled source select gate, (select gate source) 210-0 and 210-1. Source select gate 210-0 has a source region coupled to a source select line 214-0 and a drain region coupled to a source region of the second source select gate 210-1. Source select gate 210-1 (also referred to as "cell side select gate") is adjacent a first non-volatile memory cell (e.g., cell 208-1) in the string of non-volatile memory cells and has a drain region coupled to a source region of the first non-volatile memory cell. In this embodiment, source select gate 210-0 does not have a floating gate, or has a floating gate which is electrically connected to a control gate of the source select gate 210-0. According to this embodiment, source select gate 210-1 does have a floating gate, e.g., which is electrically separated by a dielectric from a control gate, and has a substantially similar cell structure to each of the non-volatile memory cells in the string of non-volatile memory cells as the same has been described in connection with FIG. 2.

The embodiment of FIG. 2 further illustrates a first and a second series coupled drain select gates, (select gate drain) 212-0 and 212-1. Drain select gate 212-0 has a drain region coupled to a bit line (BL) and a source region coupled to a drain region of the second drain select gate 212-1. Drain select gate 212-1 (also referred to as "cell side select gate") is adjacent a last non-volatile memory cell in the string of non-volatile memory cells and has a source region coupled to a drain region of the last non-volatile memory cell. In this embodiment, drain select gate 212-0 does not have a floating gate, or has a floating gate which is electrically connected to a control gate of the source select gate 212-0. According to this embodiment, drain select gate 212-1 does have a floating gate, e.g., which is electrically separated by a dielectric from a control gate, and has a substantially similar cell structure to each of the non-volatile memory cells in the string of non-volatile memory cells as described in connection with FIG. 2.

As shown in the embodiment illustrated in FIG. 2, a source of source select gate 210-0 is connected to a common source line 216. The drain of source select gate 210-0 is connected to the source of a corresponding source select gate 210-1. The drain of source select gate 210-1 is connected to the source of the memory cell 208-1 of the corresponding NAND string 206-1. A control gate 220-0 of source select gate 210-0 is connected to source select line 214-0 and a control gate 220-1 of source select gate 210-1 is connected to source select line 214-1. As noted above, in this embodiment, source select gate 210-0 does not have a floating gate. According to this embodiment, source select gate 210-1 does have a floating gate, e.g., floating gate 221-1 is electrically separated by a dielectric layer from control gate 220-1 by a dielectric layer, and has a substantially similar cell structure to each of the non-volatile memory cells, e.g., cells 208-1 to 208-N, in the string of non-volatile memory cells. As the reader will appreciate, the structure of the source select gates, e.g., 210-0 and 210-1, is the same for each NAND string 206-1 to 206-N.

The drain of drain select gate 212-0 is connected to the local bit line 204-1 for the corresponding NAND string 206-1 at drain contact 228-1. The source of drain select gate 212-0 is connected to the drain of the corresponding drain select gate 212-1. The source of drain select gate 212-1 is connected to the drain of the last floating-gate transistor 208-N of the corresponding NAND string 206-1. A control gate 225-0 of source select gate 212-0 is connected to drain select line 215-0 and a control gate 225-1 of source select gate 212-1 is connected to drain select line 215-1. As noted above, in various embodiments, drain select gate 212-0 does not have a floating gate. According to various embodiments, drain select gate 212-1 does have a floating gate, e.g., floating gate 226-1 is electrically separated by a dielectric layer from control gate 225-1 by a dielectric layer, and has a substantially similar cell structure to each of the non-volatile memory cells, e.g., cells 208-1 to 208-N, in the string of non-volatile memory cells. As the reader will appreciate, the structure of the drain select gates, e.g., 212-0 and 212-1, is the same for each NAND string 206-1 to 206-N.

Construction of non-volatile memory cells 208 includes a source 230 and a drain 232, a floating gate or charge storage layer 234, and a control gate 236, as shown in FIG. 2. Non-volatile memory cells 208 have their control gates 236 coupled to a word line 202. A column of the non-volatile memory cells 208 are those NAND strings 206 coupled to a given local bit line 204. A row of the non-volatile memory cells 208 are those transistors commonly coupled to a given word line 202. An AND array architecture would be similarly laid out except that the string of memory cells would be coupled in parallel between the select gates.

Multiple select gates on the source and/or drain ends of the strings of non-volatile memory cells facilitate a variety of programming modes that can be used to mitigate program disturb and/or the effects of GIDL. Related examples of multiple select gates on the source and/or drain ends of the strings of non-volatile memory cells to mitigate program disturb and/or the effects of GIDL are described in copending, commonly assigned US patent applications: Ser. No. 11/216,755, entitled "Multiple Select Gate Architecture", filed on Aug. 31, 2005; and Ser. No. 11/218,848, entitled "Operation of Multiple Select Gate Architecture", filed on Sep. 1, 2005, both by the same inventor as the present disclosure.

FIG. 3 illustrates one embodiment for operation voltages applied to various gates of a string of non-volatile memory cells including multiple select gates. In the embodiment of FIG. 3 a string of non-volatile memory cells each associated with a word line numbering WL-0 to WL-31. Embodiments, however, are not limited to this example of thirty-two (32) series coupled non-volatile memory cells. The embodiment of FIG. 3 illustrates a first and a second series coupled source select gates, (select gate source) SGS-0 and SGS-1. Source select gate SGS-0 has a source region coupled to a source select line (not shown) and a drain region coupled to a source region of the second source select gate SGS-1. Source select gate SGS-1 (also referred to as "cell side select gate") is adjacent a first non-volatile memory cell in the string of non-volatile memory cells and has a drain region coupled to a source region of the first non-volatile memory cell. In this embodiment, source select gate SGS-0 does not have a floating gate. According to this embodiment, source select gate SGS-1 does have a floating gate and has a substantially similar cell structure to each of the non-volatile memory cells in the string of non-volatile memory cells as the same has been described in connection with FIG. 2.

The embodiment of FIG. 3 further illustrates a first and a second series coupled drain select gates, (select gate drain) SGD-0 and SGD-1. Drain select gate SGD-0 has a drain region coupled to a bit line (BL) and a source region coupled to a drain region of the second drain select gate SGD-1. Drain select gate SGD-1 (also referred to as "cell side select gate") is adjacent a last non-volatile memory cell in the string of non-volatile memory cells and has a source region coupled to a drain region of the last non-volatile memory cell. In this embodiment, drain select gate SGD-0 does not have a floating gate. According to this embodiment, drain select gate SGD-1 does have a floating gate and has a substantially similar cell structure to each of the non-volatile memory cells in the string of non-volatile memory cells as described in connection with FIG. 2.

While FIG. 3 illustrates specific values for the applied voltages, these values should be considered for the relative magnitudes with respect to one another. As the reader will appreciate, variations of voltage levels can be utilized as absolute voltage levels are generally dependent upon the physical characteristics of an individual device.

For the various embodiments, a word line or a bit line is selected if at least one memory cell associated with that word line or bit line is being programmed. A word line or a bit line is unselected if no memory cells associated with that word line or bit line are being programmed.

The embodiment of FIG. 3 illustrates operation voltages for an ERASE operation, a PROGRAM operation, and READ operation. FIG. 3 illustrates one embodiment of the method in which operation voltages are applied for programming any of the non-volatile memory cells in the string of non-volatile memory cells. In this example, the operation voltages are illustrated in connection with the programming of a second non-volatile memory cell (e.g., associated with word line WL-1) in the string of non-volatile memory cells. As shown in the embodiment of FIG. 3, the ERASE operation includes a preprogram sequence, an erase sequence, and an erase verify sequence.

In the preprogram sequence of the ERASE operation embodiment shown in FIG. 3, the source line (not shown) is brought up to some positive potential, such as the supply potential Vcc. The bodies of the memory cells, or the well in which they are formed (e.g., P-well for n-channel FETs or +N-well for p-channel FETs), may be brought to a ground potential. The selected bit lines are brought to the ground potential. And, the word lines, WL-0 to WL-31, have a high positive potential, e.g., 18V, applied thereto (also referred to as pre-programming voltage "Vpre-pgm") applied. In this embodiment, a gate of the first source select gate SGS-0 is brought to ground while the gate of the second source select gate SGS-1 ("cell side source select gate") has the pre-programming voltage, Vpre-pgm, applied thereto. A gate of the first drain select gate SGD-0 has the supply potential applied thereto while the gate of the second drain select gate SGD-1 ("cell side drain select gate") has the pre-programming voltage, Vpre-pgm, applied thereto.

In the erase sequence of the ERASE operation embodiment shown in FIG. 3, the source line (not shown) and bit line (BL) are left floating. Likewise, the first source select gate SGS-0 and the first drain select gate SGD-0 are left floating. The bodies of the memory cells, or the well in which they are formed, have a high positive potential, e.g., 20V, applied thereto. The word lines, WL-0 to WL-31, are brought to ground. And, in this embodiment, the gate of the second source select gate SGS-1 ("cell side source select gate") and the gate of the second drain select gate SGD-1 are brought to ground.

In the erase verify sequence of the ERASE operation embodiment shown in FIG. 3, the source line (not shown) is brought to ground, the bit line (BL) is brought to approximately 1.0V. The first source select gate SGS-0 and the first drain select gate SGD-0 are brought to a positive potential which is substantially equal to a potential applied to unselected word lines of in the string of non-volatile memory cells during a read operation, e.g., 4.5 V (also referred to as a Vpass_read potential). The bodies of the memory cells, or the well in which they are formed, are brought to ground. The word lines, WL-0 to WL-31, are brought to ground. And, in this embodiment, the gate of the second source select gate SGS-1 ("cell side source select gate") and the gate of the second drain select gate SGD-1 are brought to ground.

In the PROGRAM operation embodiment shown in FIG. 3, illustrated in this example as programming the second non-volatile memory cell in the string of non-volatile memory cells (associated with word line WL-1), the source line (not shown) is brought up to some positive potential, such as the supply potential Vcc. The bodies of the memory cells, or the well in which they are formed (e.g., P-well for n-channel FETs or +N-well for p-channel FETs), may be brought to a ground potential. The selected bit lines are brought to the ground potential and the unselected bit lines are brought up to some positive potential, such as the power supply Vcc. The unselected word lines, e.g., WL-0, and WL-2 to WL-31, have a positive potential applied thereto, e.g., 10.0 V (also referred to as a Vpass or Vpass_program potential) which is greater than the positive potential (Vpass_read) applied to unselected word lines during the read operation. This positive potential, Vpass, is capable of causing memory cells on the unselected word lines to act as pass gates during the programming of the selected word line. The pass voltage Vpass is generally higher than the external supply potential (Vcc) but less than the program voltage Vpgm.

The selected word line, e.g., WL-1, receives a high positive potential, e.g., 20V, (Vpgm). The programming voltage Vpgm is some positive potential capable of programming a memory cell in conjunction with the remaining node voltages. In this embodiment, a gate of the first source select gate SGS-0 is brought to ground while the gate of the second source select gate SGS-1 ("cell side source select gate") is brought up to some positive potential, such as the supply potential Vcc. A gate of the first drain select gate SGD-0 has a positive potential applied thereto ranging from 1.0 V to the external supply potential Vcc while the gate of the second drain select gate SGD-1 ("cell side drain select gate") has the supply potential Vcc applied thereto.

In the READ operation embodiment shown in FIG. 3, the source line (not shown) is brought to ground, the selected bit line (BL) is brought to approximately 1.0V. The first and the second source select gates, SGS-0 and SGS-1 are brought to a positive potential which is substantially equal to the potential applied to unselected word lines of in the string of non-volatile memory cells during a read operation, e.g., 4.5 V (also referred to as a Vpass_read potential). The first and the second drain select gates, SGD-0 and SGD-1 are also brought to a positive potential which is substantially equal to the Vpass_read potential, e.g., 4.5 V. The bodies of the memory cells, or the well in which they are formed, are brought to ground. The unselected word lines, e.g., WL-0, and WL-2 to WL-31, have the positive potential Vpass_read, e.g., 4.5 V, applied thereto. And, the selected word line, e.g., WL-1, is brought to ground.

As the reader will appreciate, the above embodiment thus described operation of a "cell side select gate", e.g. SGS-1 and SGD-1, which is the same as the operation of the non-volatile memory cells in the string of non-volatile memory cells except for during the PROGRAM operation. During the PROGRAM operation, some positive potential, such as the supply potential Vcc, which is greater than the ground potential, but less than the Vpass_read potential is applied to the cell side select gate. Depending on the particular memory system Vcc may be a positive potential which is greater that 0.0 V and less than about 5.0 V. In one embodiment, Vcc is applied and is in the range of 2.5 to 4.0 V. The reader will appreciate that the above described embodiment may reduce GIDL relative to memory array utilizing a single source select gate, and program disturb is mitigated for the first word line as well as the string of non-volatile memory cells as a whole, while effectively reducing the space needed for the layout of the array.

Figure 4:
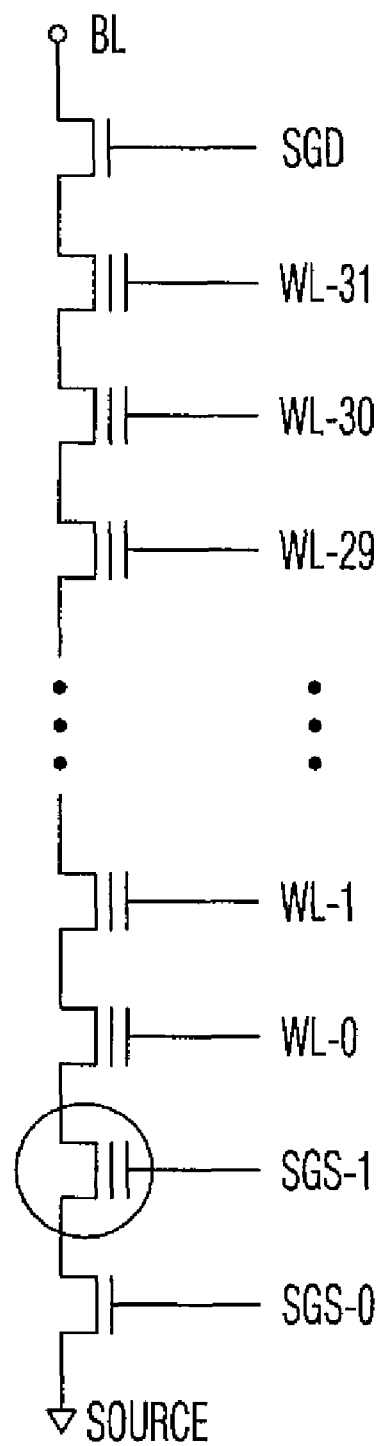
FIG. 4 illustrates another embodiment for a string of non-volatile memory cells including multiple select gates.

FIG. 4 illustrates another embodiment for a string of non-volatile memory cells including multiple select gates. In the embodiment of FIG. 4 a string of non-volatile memory cells each associated with a word line numbering WL-0 to WL-31. Embodiments, however, are not limited to this example of thirty-two (32) series coupled non-volatile memory cells. The embodiment of FIG. 4 illustrates a first and a second series coupled source select gates, (select gate source) SGS-0 and SGS-1. Source select gate SGS-0 has a source region coupled to a source select line (not shown) and a drain region coupled to a source region of the second source select gate SGS-1. Source select gate SGS-1 (also referred to as "cell side select gate") is adjacent a first non-volatile memory cell in the string of non-volatile memory cells and has a drain region coupled to a source region of the first non-volatile memory cell. In this embodiment, source select gate SGS-0 does not have a floating gate. According to this embodiment, source select gate SGS-1 does have a floating gate and has a substantially similar cell structure to each of the non-volatile memory cells in the string of non-volatile memory cells as the same has been described in connection with FIG. 2.

The embodiment of FIG. 4 further illustrates the optional use of a single drain select gate, (select gate drain) SGD. Drain select gate SGD has a drain region coupled to a bit line (BL) and a source region coupled to a drain region of a last non-volatile memory cell in the string of non-volatile memory cells. In this embodiment, drain select gate SGD does not have a floating gate, or has a floating gate which is electrically connected to a control gate of the drain select gate SGD. Operation voltages can be applied to this embodiment analogous to the treatment described in connection with FIG. 3, excepting the description therein provided for drain select gate SGD-1.

Figure 5:
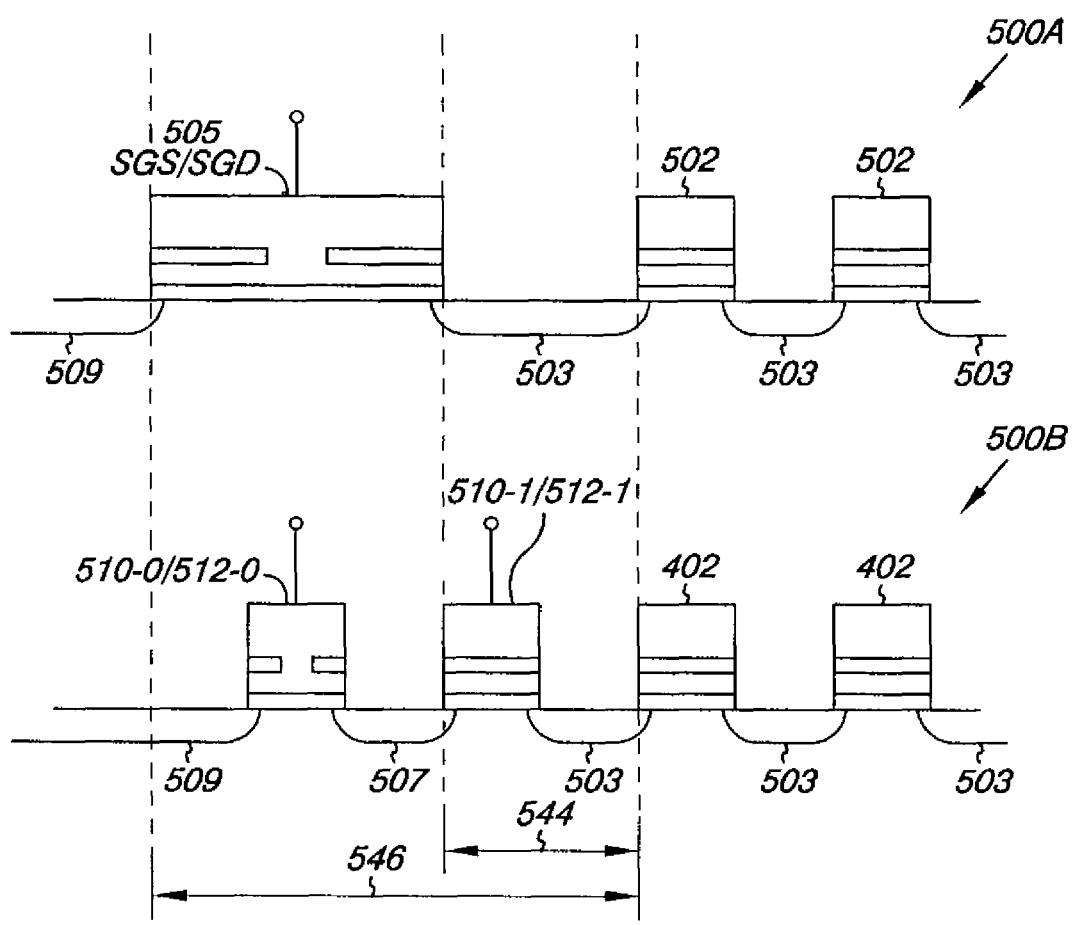
FIG. 5 is a cross-sectional view comparing a portion of a memory array of a prior art configuration with a portion of a memory array in accordance with an embodiment of the present disclosure.

FIG. 5 is a cross-sectional view comparing a portion of a memory array 500A of a prior art configuration with a portion of a memory array 500B in accordance with an embodiment of the present disclosure. FIG. 5 could depict either the source side or drain side of a string of non-volatile memory cells, e.g., a NAND string, and demonstrates a reduction in array layout size facilitated by embodiments of the present disclosure, e.g., using two select gates in series where a cell side select gate has a substantially similar structure to the non-volatile memory cells in the string of non-volatile memory cells.

As shown in FIG. 5, the distance 544 between a last word line 502, associated with a non-volatile memory cell, and the inner edge of a select line, associated with a source and/or drain select gate (SGS/SGD) 505, in the prior art 500A is greater than a distance between a last word line 502 and the inner edge of a cell side select line 510-1/512-1 according to embodiments of the present disclosure 500B. Similarly, the distance 546 between a last word line 502 and the outer edge of a select line 505 is greater than a distance between a last word line 502 and the outer edge of an outer most select line 510-0/512-0.

Figure 1:
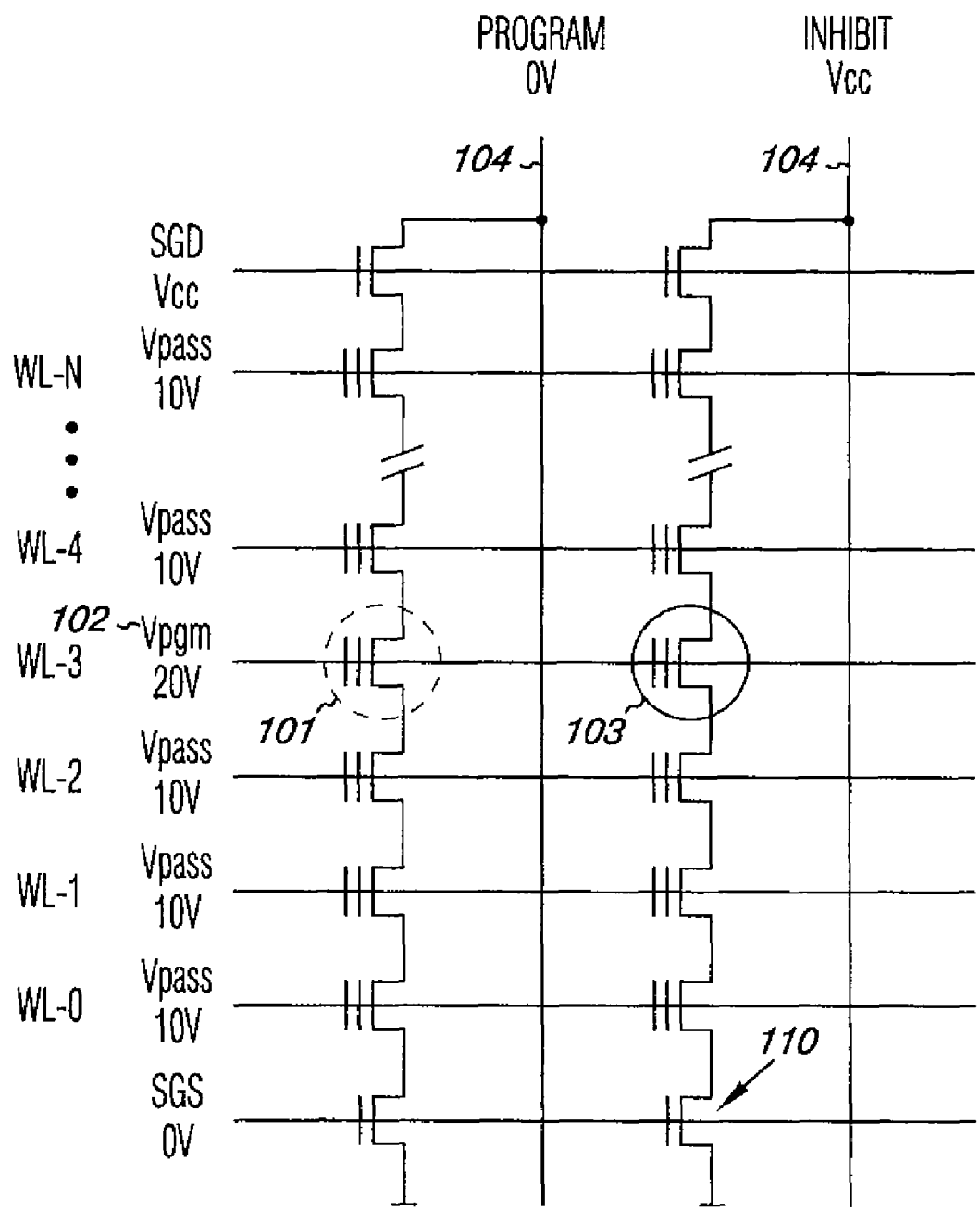
FIG. 1 is a schematic of a portion of a NAND memory array of the prior art.

As described in connection with FIG. 1, the source/drain regions 503 of non-volatile memory cells in an unselected string of non-volatile memory cells, e.g., an unselected NAND string, may be boosted, e.g., to 7-8V, while the source/drain regions 509 of a select gate are coupled to receive a lower voltage such as a supply potential (Vcc), e.g., 0.0 to 4.0 V. However, due to the voltage drop across the cell side select gate 510-1/512-1 of memory array 500B, the source/drain region 507 will have an intermediate potential. For example, source/drain region 507 may have a potential level of approximately 1-2 V in this scenario, which is sufficiently low to effectively mitigate GIDL from the outer most select gate 510-0/512-0. Thus it can be seen that with smaller device size and closer spacing of the multiple select gates, a reduction in memory array layout size can be achieved without sacrificing shut-off and punch-through characteristics. To achieve further reductions in memory array sizing, various embodiments may utilize a staggered and self-aligned bit line contact structure.

Figure 6A:
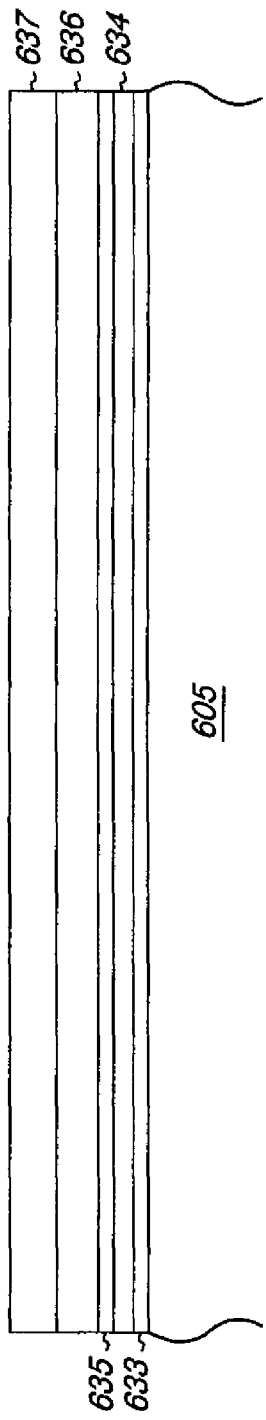

FIGS. 6A-6I illustrate a method embodiment for forming multiple select gates in association with a string of non-volatile memory cells according to the present disclosure. FIG. 6A illustrates a portion of the memory array after several processing steps have occurred. FIG. 6A may represent a semiconductor substrate 605 upon which layers of future gate stacks of non-volatile memory cells are formed. For one embodiment, a tunnel dielectric layer 633, a floating-gate layer 634, an intergate dielectric layer 635, a control gate layer 636 and cap layer 637 have been formed on a substrate 605. The memory array of FIGS. 6A-6I will be discussed with reference to floating-gate nonvolatile memory cells, although the concepts apply to other types of non-volatile memory cells. For example, the layers 633, 634 and 635 could represent a charge-trapping floating node arrangement, such as an ONO (oxide-nitride-oxide) structure of an NROM memory cell. Because the chosen layers for the gate stacks are not a feature or limitation of the invention, other structures may be chosen provided the memory cell gate stacks are capable to selectively providing one of two or more threshold voltages.

Figure 6B:
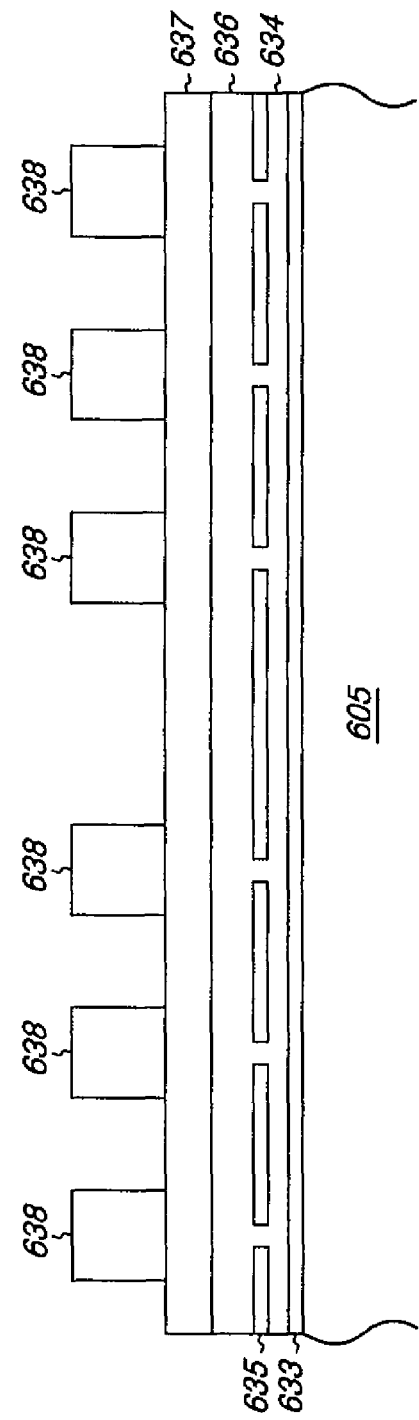

In FIG. 6B, a mask layer 638 is formed and patterned overlying the cap layer 637 once breaks to the intergate dielectric layer 635 have been formed by existing processing techniques. As one example, a photolithographic resist material could be deposited as mask layer 638 overlying the cap layer 637, exposed to a radiation source, such as UV light, and developed to define areas overlying the cap layer 637 for removal. Formation of the type of structure depicted in FIGS. 6A and 6B will be understood by one of ordinary skill in the art and are not described in more detail herein so as not to obscure embodiments of the present disclosure.

Figure 6C:
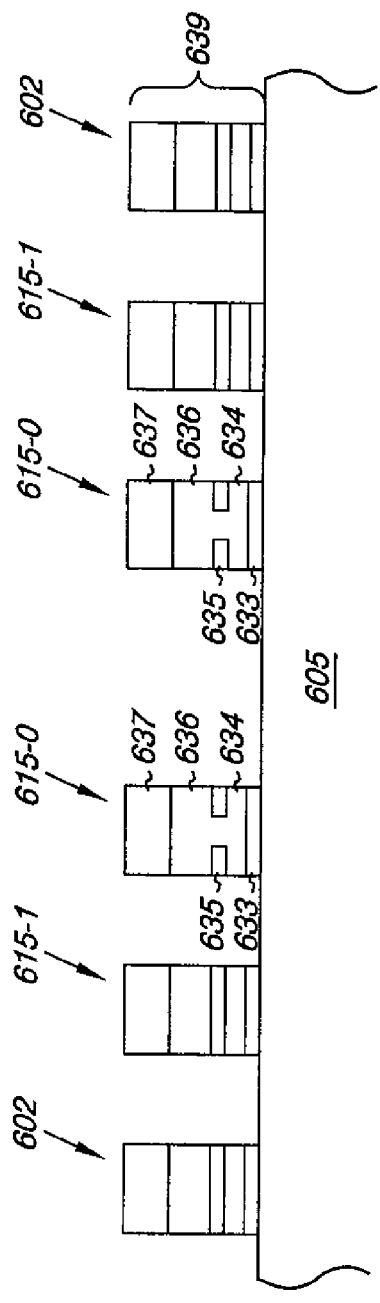

Following this patterning of the mask layer 638, exposed portions of the cap layer 637 and underlying layers are removed in FIG. 6C, such as by etching or other removal process, to expose the substrate 605. More than one removal process may be used where the chosen removal process is ineffective at removing an underlying layer. Following removal, one or more gate stacks for word lines 602 and one or more gate stacks for select lines 615-0 and 615-1 are defined.

In FIG. 6C the select line gate stacks 615-0 and 615-1 and the non-volatile memory cells 602 are illustrated as having conductive layers 634 and 636 conductively strapped together. As will be described further in connection with FIGS. 6D and 6E, such a conductive strap is eventually removed from select line gate stacks 615-1 and the non-volatile memory cells. It is further noted that the portion of the memory array depicted in FIG. 6C includes portions of two adjacent strings on non-volatile memory cells, e.g., two adjacent NAND strings.

Figure 6D:
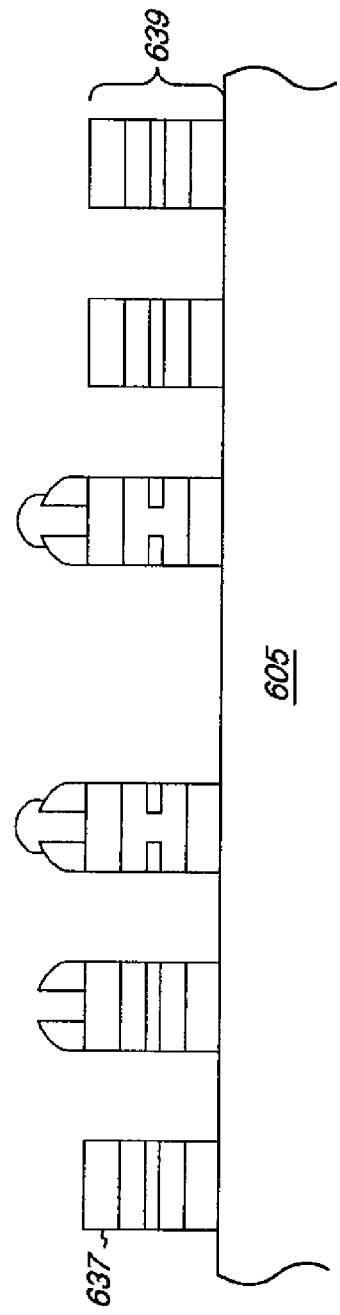
Figure 6E:
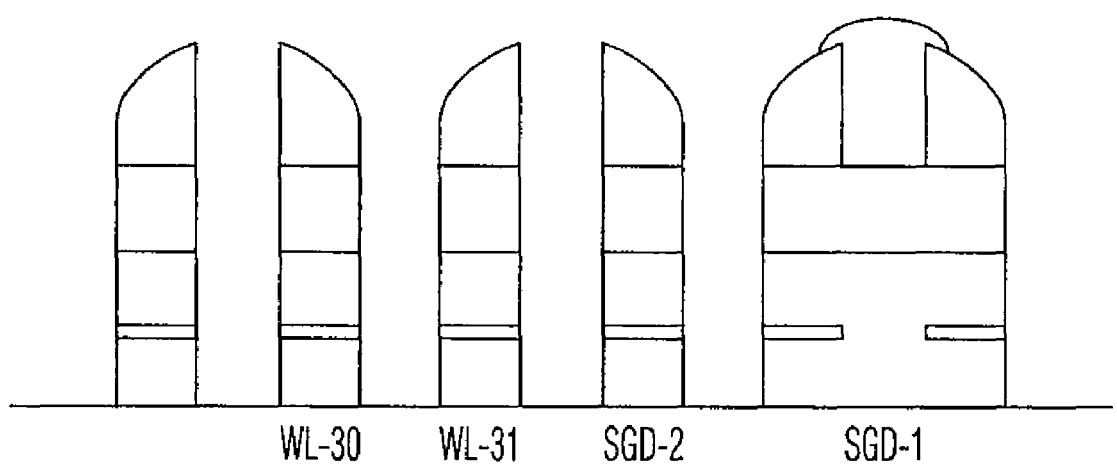

FIGS. 6D and 6E illustrate processing steps subsequent to that shown in FIG. 6C in order to remove a conductive strap from select line gate stacks 615-1 and the non-volatile memory cells 602 according to an embodiment of the present disclosure. FIG. 6D illustrates a mask layer applied to the cap layer 637 of the memory cells 602, the select line gate stacks 615-0, and the select gate line stacks 615-1. FIG. 6D further illustrates a photoresist or antireflective film applied to the masking features on select line gate stacks 615-0 such that the conductive strap is not removed from select line gate stacks 615-0 after a processing step, e.g., etching, as shown in FIG. 6E.

FIG. 6E illustrates select gate line stacks and non-volatile memory cells subsequent to an etching step to remove a conductive strap from cell-side select line gate stacks, e.g., 615-1, and from memory cells 602. FIG. 6E illustrates a select gate stack SGD-1 in which the conductive strap has not been removed. That is, select gate stack SGD-1 has its floating gate layer and control gate layer conductively strapped together, e.g, electrically connected. FIG. 6E further depicts a cell-side select line gate stack SGD-2, e.g., 615-1, in which the conductive strap has been removed. That is, select gate stack SGD-2 has its floating gate layer and control gate layer electrically separated by a dielectric layer, e.g., layer 635. FIG. 6E further shows memory cell stacks, e.g., associated with WL-31 and WL-30, in which the conductive strap has been removed. That is, memory cell stacks associated with WL-31 and WL-30 have floating gate and control gate layers separated by a dielectric layer.

Figure 6F:
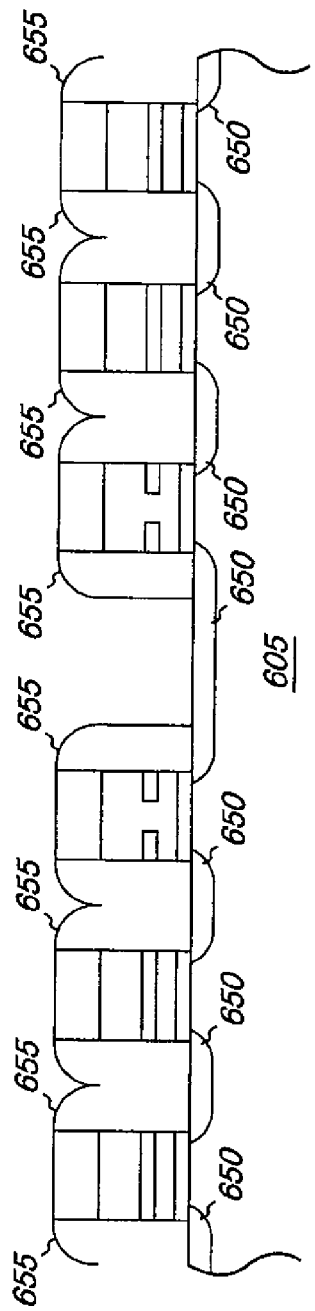

In FIG. 6F, source/drain regions 650 are formed, such as by conductive doping of portions of the substrate 605 exposed in FIG. 6E. Dielectric spacers 655 may also be formed. As one example, a blanket deposit of some dielectric material, e.g., silicon nitride, is formed overlying the gate stacks 602, 615-0, and 615-1, followed by an anisotropic removal of the blanket deposit to form spacers and expose portions of the substrate 605.

Figure 6G:
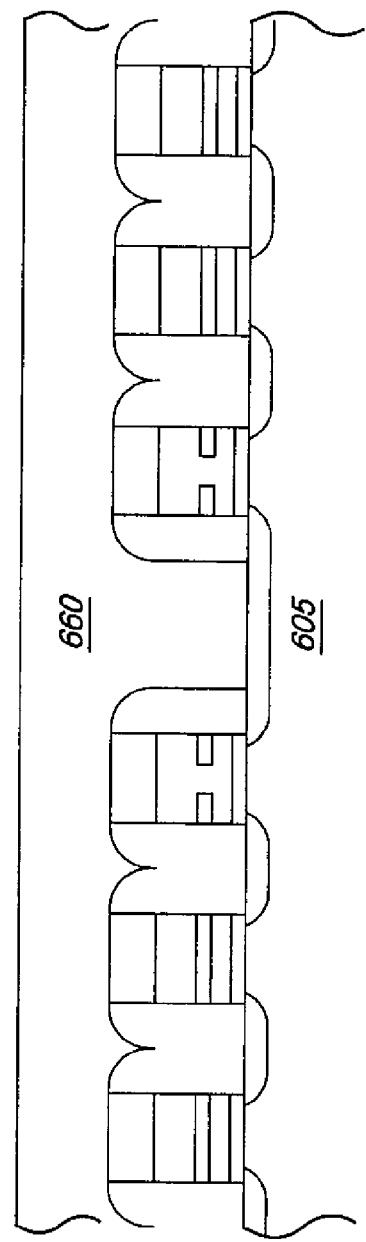

In FIG. 6G, a bulk dielectric layer 660 is formed overlying the gate stacks 602, 615-0, and 615-1. The bulk dielectric layer 660 may be any dielectric layer. As one example, the bulk dielectric layer 660 is a doped silicate material, such as borophosphosilicate glass (BPSG). In FIG. 6H, an opening 662 is formed in the bulk dielectric layer 660 overlying at least a portion of one of the select line gate stacks 615-0 and exposing at least a portion of the source/drain region 650 located between select line gate stacks 615-0 of adjacent NAND strings.

By forming the opening 662 to overlie at least a portion of a select line gate stack 615-0, the contact area to the source/drain region 650 between adjacent outer select line gate stacks 615-0 can be made smaller than the minimum feature size capabilities of the fabrication process used in forming the array. Alignment concerns are also lessened. In FIG. 6I, a bit line contact 628 is formed in the opening 662 and a bit line 604 is formed coupled to the bit line contact 628. Note that because these opposing strings of series-coupled memory cells are selectively coupled to the same bit line 604, the select gates 615-0 and 615-1 of each string must receive different control signals to selectively couple no more than one string to the bit line 604 during memory access.

Figure 7:
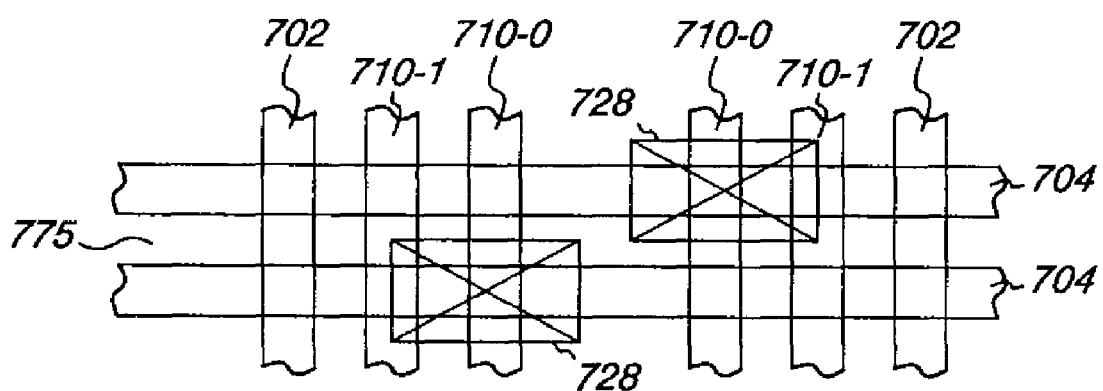
FIG. 7 is a top view of a portion of a memory array in accordance with an embodiment of the present disclosure.

FIG. 7 is a top view of the portion of the memory array of FIG. 6I illustrating word lines 702 and select gate lines 710-0 and 710-1 for embodiments with a first and a second select gate respectively. The embodiment of FIG. 7 illustrates how the bit line contacts 728 could be staggered in alternating bit lines 704 to reduce likelihood of shorting between adjacent bit lines 704. It is noted that isolation regions 775, such as shallow trench isolation, are formed in the substrate 705 generally between adjacent word lines 704, thereby defining individual memory cells occurring at the intersections of a word line 702 and each bit line 704.

FIG. 8 illustrates additional embodiments for operation voltages applied to various gates of a string of non-volatile memory cells including multiple select gates. In the embodiment of FIG. 8 a string of non-volatile memory cells each associated with a word line numbering WL-0 to WL-31 is provided non-schematically on the left vertical side of the drawing. As noted with FIG. 3, embodiments are not limited to this example of thirty-two (32) series coupled non-volatile memory cells. The embodiment of FIG. 8 illustrates a first and a second series coupled source select gates, (select gate source) SGS-0 and SGS-1, also shown in the left column. Source select gate SGS-0 has a source region (not shown) coupled to a source select line, representatively labeled as SOURCE in the left column, and a drain region (not shown) coupled to a source region (not shown) of the second source select gate SGS-1. Source select gate SGS-1 (also referred to as "cell side select gate") is adjacent a first non-volatile memory cell in the string of non-volatile memory cells, i.e., associated with word line labeled WL-0, and has a drain region (not shown) coupled to a source region (not shown) of the first non-volatile memory cell.

In the embodiment of FIG. 8, source select gate SGS-0 is treated as not having a floating gate and/or having a control gate electrically strapped, e.g., electrically connected, to a floating gate layer as represented schematically in FIG. 2 and mentioned in discussion in connect with FIG. 6C. In FIG. 8, source select gate SOS-1 is discussed as having a floating gate and having a substantially similar cell structure to each of the non-volatile memory cells in the string of non-volatile memory cells as described in various embodiments above.

The embodiment of FIG. 8 further contemplates a first and a second series coupled drain select gates, (select gate drain) SGD-0 and SGD-1, labeled as such in the left column. As described in connection with FIG. 3, drain select gate SGD-0 has a drain region (not shown) coupled to a bit line (BL), also labeled as such in the left column and a source region (not shown) coupled to a drain region (not shown) of the second drain select gate SGD-1. Drain select gate SGS-1 (also referred to as "cell side select gate") is adjacent a last non-volatile memory cell, i.e., associated with word line labeled WL-31, in the string of non-volatile memory cells and has a source region (not shown) coupled to a drain region (not shown) of the last non-volatile memory cell.

In this embodiment, drain select gate SGD-0 does not have a floating gate and/or has a control gate electrically strapped, e.g., electrically connected, to a floating gate layer as represented schematically in FIG. 2 and mentioned in discussion in connect with FIG. 6C. According to this embodiment, drain select gate SGD-1 does have a floating gate, e.g., which is electrically separated by a dielectric from a control gate, and has a substantially similar cell structure to each of the non-volatile memory cells in the string of non-volatile memory cells as described in connection with FIG. 2.

Although FIG. 8 again illustrates specific values for the applied voltages, these values should be considered for the relative magnitudes with respect to one another. Variations of voltage levels can be utilized as absolute voltage levels are generally dependent upon the physical characteristics of an individual device. As used in FIG. 8, a word line or a bit line is selected if at least one memory cell associated with that word line or bit line is being programmed. A word line or a bit line is unselected if no memory cells associated with that word line or bit line are being programmed.

The embodiment of FIG. 8 illustrates operation voltages for an ERASE operation, a PROGRAM operation, and READ operation. FIG. 8 illustrates various method embodiments for adjusting a threshold voltage for a cell side select gate, e.g., SGS-1 and SGD-1, when programming is performed on the adjacent non-volatile memory cell. In this example, the operation voltages are illustrated in connection with the programming of the first non-volatile memory cell associated with word line WL-0. FIG. 8 additionally illustrates various method embodiments which treat the potential applied to the cell side select gate, e.g., SGS-1 and SGD-1, when programming is performed on a non-volatile memory cell which is non-adjacent to the cell side select gate, e.g., a third non-volatile memory cell associated with word line WL-2 in the string of non-volatile memory cells. As shown in the embodiment of FIG. 8, the ERASE operation includes a preprogram sequence, an erase sequence, an erase verify sequence, and two embodiments representing soft programming as part of the ERASE operation.

In the preprogram sequence of the ERASE operation embodiment shown in FIG. 8, the source line is brought up to some positive potential, such as the internal supply potential (Vccr), e.g., 2.4-2.5V. The bodies of the memory cells, or the well in which they are formed (e.g., P-well for n-channel FETs or +N-well for p-channel FETs), may be brought to a ground potential. The selected bit lines are brought to the ground potential. And, the word lines, WL-0 to WL-31, receive a pre-programming voltage, "Vppgm", e.g., 17-18 V. In this embodiment, a gate of the first source select gate SGS-0 and the gate of the second source select gate SGS-1 ("cell side source select gate") are brought to ground. A gate of the first drain select gate SGD-0 and the gate of the second drain select gate SGD-1 ("cell side drain select gate") receive a positive potential, e.g., 3.6 V.

In the erase sequence of the ERASE operation embodiment shown in FIG. 8, the source line and bit line (BL) are left floating. Likewise, the first and the second source select gates, SGS-0 and SGS-1, and the first and the second drain select gates, SGD-0 and SGD-1, are left floating. The bodies of the memory cells, or the well in which they are formed, have a high positive potential e.g., 20V, applied thereto. The word lines, WL-0 to WL-31, are brought to ground.

In the erase verify sequence of the ERASE operation embodiment shown in FIG. 8, the source line is brought up to some positive potential, such as the internal supply potential (Vccr) and the bit line (BL) is brought to ground. The first and the second source select gates, SGS-0 and SGS-1, and the first and the second drain select gates, SGD-0 and SGD-1 receive a positive potential, e.g., 3.6 V. The bodies of the memory cells, or the well in which they are formed, are brought to ground. The word lines, WL-0 to WL-31, are brought to ground.

In FIG. 8, a first and a second soft programming sequence embodiment are illustrated in connection with the ERASE operation. In the first soft programming sequence embodiment the source line is brought up to some positive potential, such as the internal supply potential (Vccr). The bit line (BL) and the first and the second source select gates, SGS-0 and SGS-1, are brought to ground. The first and the second drain select gates, SGD-0 and SGD-1 receive a positive potential, e.g., 3.6 V. The bodies of the memory cells, or the well in which they are formed, are brought to ground and the word lines, WL-0 to WL-31, receive a soft programming voltage, "Vspgm", e.g., 14-15 V with potential step-up of 0.5V.

In the second soft programming sequence embodiment the source line is brought up to some positive potential, such as the supply potential Vccr. The bit line (BL) and the first source select gate SGS-0 are brought to ground. The second source select gate SGS-1 receives a second soft programming voltage, "Vspgm2", e.g., 17-18V with potential step-up of 0.5V, different from the value of Vspgm. The first and the second drain select gates, SGD-0 and SGD-1 receive a positive potential, e.g., 3.6 V. The bodies of the memory cells, or the well in which they are formed, are brought to ground and the word lines, WL-0 to WL-31, have the Vpass potential applied thereto, e.g., 10 V. As the reader will appreciate, the above described embodiments allow for a threshold voltage of the second source select gate to be elevated when the non-volatile memory cell adjacent to the second source select gate is to be programmed during the program operation. In various embodiments the threshold voltage for the second source select gate SGS-1, which has a cell structure substantially similar to the non-volatile memory cells in the string of non-volatile memory cells, is set to a higher threshold voltage, e.g., has its floating programmed to the "0" programmed state by soft program during the ERASE operation.

In the PROGRAM operation embodiment shown in FIG. 8, an example is provided for programming a non-volatile memory cell adjacent to a cell side select gate, e.g., the non-volatile memory cell associated with word line WL-0 adjacent to SGS-1, and for programming a non-volatile memory cell which is non-adjacent to a cell side select gate, e.g., a third non-volatile memory cell associated with word line WL-2.

In the first example, connected with programming the non-volatile memory cell associate with WL-0 and adjacent to cell side select gate SGS-1, the source line is brought up to some positive potential, such as the supply potential Vccr. The bodies of the memory cells, or the well in which they are formed (e.g., P-well for n-channel FETs or +N-well for p-channel FETs), may be brought to a ground potential. The selected bit lines are brought to the ground potential and the unselected bit lines are brought up to some positive potential, such as the power supply Vccr. The unselected word lines, e.g., WL-1 to WL-31, have the Vpass potential applied thereto, e.g., 10.0 V. The selected word line, e.g., WL-0, receives a program potential "Vpgm", e.g., 20V. In this embodiment, a gate of the first source select gate SGS-0 is brought to ground while the gate of the second source select gate SGS-1 ("cell side source select gate") is brought up to Vpass. The gates of the first and the second drain select gates, SGD-0 and SGD-1, have a positive potential applied thereto, e.g., 3.6 V. As noted above, the pass voltage Vpass is generally higher than the supply potential Vcc but less than the program voltage Vpgm.

In the second example, connected with programming the non-volatile memory cell associate with WL-2 which is non-adjacent to cell side select gate SGS-1, the source line is brought up to some positive potential, such as the supply potential Vccr. The bodies of the memory cells, or the well in which they are formed (e.g., P-well for n-channel FETs or +N-well for p-channel FETs), are brought to a ground potential. The selected bit lines are brought to the ground potential and the unselected bit lines are brought up to some positive potential, such as the power supply Vcc. The unselected word lines, e.g., WL-0, WL-1, and WL-3 to WL-31, have the Vpass potential applied thereto and the selected word line, e.g., WL-2, receives the Vpgm potential. In this embodiment, a gate of the first source select gate SGS-0 is brought to ground while the gate of the second source select gate SGS-1 ("cell side source select gate") is brought up to the power supply potential Vcc. The gates of the first and the second drain select gates, SGD-0 and SGD-1, have a positive potential applied thereto, e.g., 3.6 V. As the reader will appreciate, the above described embodiments which apply the Vpass potential to the second source select gate during WL-0 programming to improve both program disturb issues and word line to select gate (WL-SG) breakdown issues. Otherwise, Vpass_read or the supply potential Vcc is applied to the second source select gate SGS-1 during other WL programming, e.g., WL-1 to WL-31. In various embodiments, the threshold voltage for the second source select gate SGS-1 is adjusted (when the non-volatile memory cell adjacent to the second source select gate is to be programmed) by soft programming during the ERASE operation so as not to degrade program performance. The floating gate structure of the second source select gate SGS-1, which has a cell structure substantially similar to the non-volatile memory cells in the string of non-volatile memory cells, is also programmed in the pre-program sequence of the ERASE operation so as not to degrade program performance. In various embodiments, the floating gate structure of the second source select gate SGS-1 may also be programmed by one or more additional program sequences which may involve a trade-off between program performance and accuracy of threshold voltage control.

In the READ operation embodiment shown in FIG. 8, the source line is brought to ground, the selected bit line (BL) is brought to approximately 1.0V. The first and the second source select gates, SGS-0 and SOS-1 and the first and the second drain select gates, SGD-0 and SGD-1 are brought to a positive potential, e.g., 3.6 V. The bodies of the memory cells, or the well in which they are formed, are brought to ground. The unselected word lines, e.g., WL-1 to WL-31, have the positive potential Vpass_read, e.g., 4.5 V, applied thereto. And, the selected word line, e.g., WL-0, is brought to ground.

Figure 9:
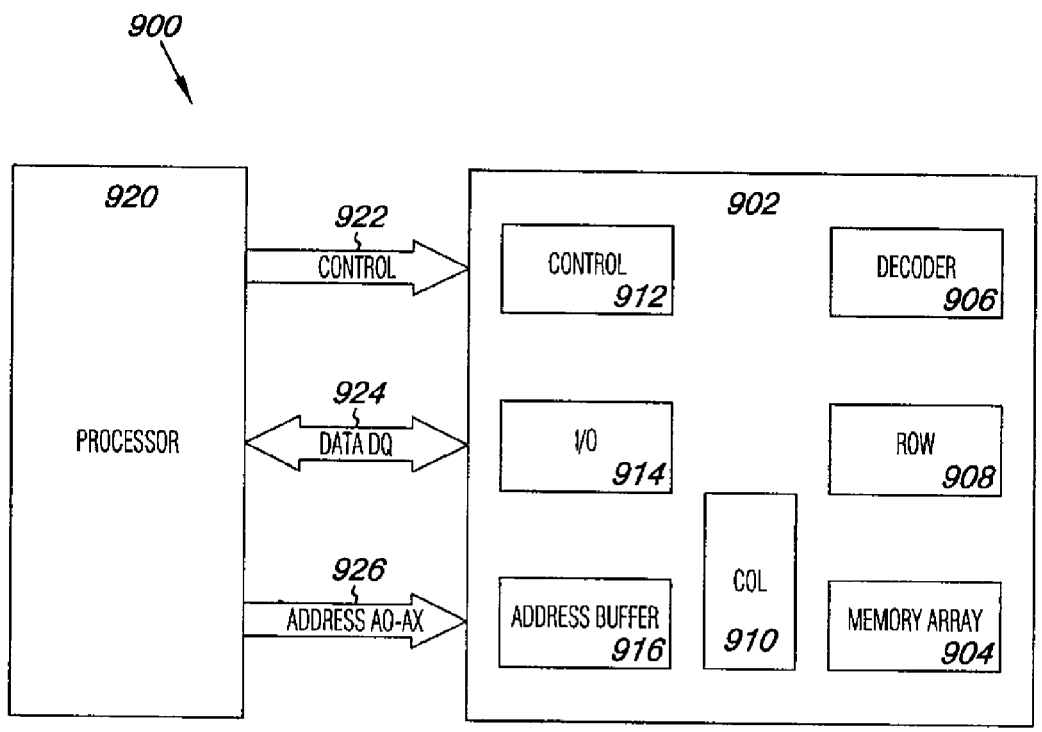
FIG. 9 is a functional block diagram of an electronic system having at least one memory device in accordance with an embodiment of the present disclosure.

FIG. 9 is a simplified block diagram of an electronic system 900, according to an embodiment of the invention. Electronic system 900 includes a non-volatile memory device 902 that includes an array of non-volatile memory cells 904, an address decoder 906, row access circuitry 908, column access circuitry 910, control circuitry 912, Input/Output (I/O) circuitry 914, and an address buffer 916. The array of non-volatile memory cells 904 has a non-volatile memory, e.g., NAND, architecture in accordance with an embodiment of the invention. The memory cells (not shown in FIG. 9) of the array of non-volatile memory cells 904 may be floating-gate memory cells, NROM cells or other type of one-transistor non-volatile memory cells.

Electronic system 900 includes an external processor 920, e.g., a memory controller or host processor, electrically connected to memory device 902 for memory accessing. The memory device 902 receives control signals from the processor 920 over a control link 922. The memory cells are used to store data that are accessed via a data (DQ) link 924. Address signals are received via an address link 926 that are decoded at address decoder 906 to access the memory array 904. Address buffer circuit 916 latches the address signals. The memory cells are accessed in response to the control signals and the address signals. The control link 922, data link 924 and address link 926 can be collectively referred to as access lines. It will be appreciated by those skilled in the art that additional circuitry and control signals can be provided, and that the memory device detail of FIG. 9 has been reduced to facilitate ease of illustration.

Figure 10:
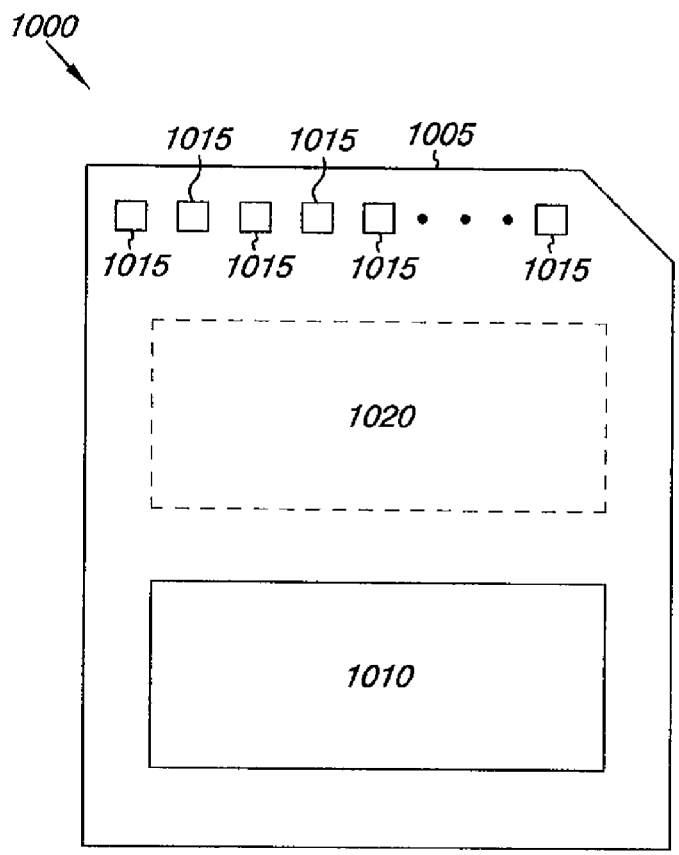
FIG. 10 is a functional block diagram of a memory module having at least one memory device in accordance with an embodiment of the present disclosure.

FIG. 10 is an illustration of an exemplary memory module 1000. Memory module 1000 is illustrated as a memory card, although the concepts discussed with reference to memory module 1000 are applicable to other types of removable or portable memory, e.g., USB flash drives, and are intended to be within the scope of "memory module" as used herein. In addition, although one example form factor is depicted in FIG. 10, these concepts are applicable to other form factors as well.

In some embodiments, memory module 1000 will include a housing 1005 (as depicted) to enclose one or more memory devices 1010, though such a housing is not essential to all devices or device applications. At least one memory device 1010 is a non-volatile memory having an architecture in accordance with an embodiment of the invention. Where present, the housing 1005 includes one or more contacts 1015 for communication with a host device. Examples of host devices include digital cameras, digital recording and playback devices, PDAs, personal computers, memory card readers, interface hubs and the like. For some embodiments, the contacts 1015 are in the form of a standardized interface. For example, with a USB flash drive, the contacts 1015 might be in the form of a USB Type-A male connector. For some embodiments, the contacts 1015 are in the form of a semi-proprietary interface, such as might be found on Compact-Flash™ memory cards licensed by SanDisk Corporation, Memory Stick™ memory cards licensed by Sony Corporation, SD Secure Digital™ memory cards licensed by Toshiba Corporation and the like. In general, however, contacts 1015 provide an interface for passing control, address and/or data signals between the memory module 1000 and a host having compatible receptors for the contacts 1015.

The memory module 1000 may optionally include additional circuitry 1020 which may be one or more integrated circuits and/or discrete components. For some embodiments, the additional circuitry 1020 may include a memory controller for controlling access across multiple memory devices 1010 and/or for providing a translation layer between an external host and a memory device 1010. For example, there may not be a one-to-one correspondence between the number of contacts 1015 and a number of 1010 connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010 such as logic functions as might be performed by an application specific integrated circuit (ASIC). Also, the additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

CONCLUSION

Non-volatile memory devices have been described utilizing an architecture including multiple series-coupled select gates on the source and/or drain ends of non-volatile memory cell strings. By utilizing multiple series-coupled select gates, each gate can be made using smaller features sizes while achieving the same level of protection against GIDL and other forms of current leakage. By reducing the feature size of the select gates, the footprint of the non-volatile memory cell strings can be reduced, thereby facilitating smaller memory device sizing. A least one of the multiple series-coupled select gates on the source and/or drain ends includes a control gate and a floating gate electrically connected together and a second select gate having a control gate and a floating gate which are electrically separated by a dielectric layer.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory system, comprising:
  applying a first word line potential to a number of unselected non-volatile memory cells in a NAND string;
  applying a second word line potential to a selected non-volatile memory cell in the NAND string;
  applying a source select line potential to a first source select gate; and
  applying a source select line potential to a second source select gate which is different from the source select line potential applied to the first source select gate, wherein applying the source select line potential to the second source select gate includes:
   setting a threshold voltage of the second source select gate to an elevated threshold voltage when a non-volatile memory cell in the NAND string adjacent to the second source select gate is to be programmed during a program operation;

applying a first potential to the second source select gate during a read operation; and applying a second potential to the second source select gate during a program operation.

2. The method of claim 1, wherein setting the threshold voltage of the second source select gate to the elevated threshold voltage includes setting the threshold voltage of the second source select gate to a threshold voltage greater than 0 volts but less than the first word line potential applied to the number of unselected non-volatile memory cells during the read operation (Vpass_read).

3. The method of claim 1, wherein applying the second potential to the second source select gate includes applying a potential to the second source select gate which is greater than 0 volts but less than a program voltage level of the memory system.

4. The method of claim 1, wherein, when programming the non-volatile memory cell in the NAND string adjacent to the second source select gate, the method includes applying a potential (VSGS-1_WL0) to the second source select gate which is substantially equal to the first word line potential applied to the number of unselected non-volatile memory cells during the program operation (Vpass).

5. The method of claim 4, wherein, when programming a non-volatile memory cell in the NAND string other than the non-volatile memory cell in the NAND string adjacent to the second source select gate, the method includes applying a potential (VSGS-1_WLother) to the second source select gate which is less than the first word line potential applied to the number of unselected non-volatile memory cells during the program operation (Vpass).

6. The method of claim 5, wherein applying the potential VSGS-1_WL0 includes applying a potential that is different from the potential VSGS-1_WLother.

7. The method of claim 5, wherein applying the potential VSGS-1_WL0 includes applying a potential that is greater than the potential VSGS-1_WLother.

8. The method of claim 1, wherein, when programming a non-volatile memory cell in the NAND string other than the non-volatile memory cell in the NAND string adjacent to the second source select gate, the method includes applying a potential to the second source select gate which is substantially equal to a supply potential (Vcc) of the memory system.

9. The method of claim 1, wherein the method includes controlling the threshold voltage of the second source select gate by soft programming during an erase operation.

* * * * *